United States Patent
Rudelic et al.

(10) Patent No.: US 9,037,788 B2
(45) Date of Patent: May 19, 2015

(54) VALIDATING PERSISTENT MEMORY CONTENT FOR PROCESSOR MAIN MEMORY

(75) Inventors: John Rudelic, Folsom, CA (US); August Camber, Rocklin, CA (US)

(73) Assignee: Micron Technology, Inc., Boise, ID (US)

( * ) Notice: Subject to any disclaimer, the term of this patent is extended or adjusted under 35 U.S.C. 154(b) by 235 days.

(21) Appl. No.: 12/895,627

(22) Filed: Sep. 30, 2010

(65) Prior Publication Data
US 2012/0084496 A1 Apr. 5, 2012

(51) Int. Cl.
| G06F 12/00 | (2006.01) |
| G06F 12/02 | (2006.01) |
| G06F 11/10 | (2006.01) |
| G06F 13/00 | (2006.01) |
| G06F 12/10 | (2006.01) |

(52) U.S. Cl.
CPC ........ G06F 12/0238 (2013.01); G06F 11/1032 (2013.01); *G06F 12/1009* (2013.01); *G06F 2212/1032* (2013.01); *G06F 2212/202* (2013.01); *G06F 2212/7209* (2013.01)

(58) Field of Classification Search
CPC .................................. G06F 3/068; G06F 12/00
USPC .......................................... 711/100, 104, 154
See application file for complete search history.

(56) References Cited

U.S. PATENT DOCUMENTS

| 6,625,756 B1* | 9/2003 | Grochowski et al. | 714/17 |
| 6,807,615 B1* | 10/2004 | Wong et al. | 711/202 |
| 6,952,797 B1* | 10/2005 | Kahn et al. | 714/770 |
| 7,035,987 B2* | 4/2006 | Rudelic | 711/170 |
| 7,103,718 B2* | 9/2006 | Nickel et al. | 711/115 |
| 7,269,608 B2* | 9/2007 | Wong et al. | 1/1 |
| 7,761,625 B2* | 7/2010 | Karamcheti et al. | 710/62 |
| 7,917,812 B2* | 3/2011 | Ginggen et al. | 714/55 |
| 8,296,496 B2* | 10/2012 | Mogul et al. | 711/102 |
| 2004/0242029 A1 | 12/2004 | Nakamura et al. | |
| 2005/0166020 A1 | 7/2005 | Jamil et al. | |
| 2006/0265544 A1 | 11/2006 | Rudelic | |
| 2007/0113044 A1 | 5/2007 | Day et al. | |
| 2007/0136607 A1 | 6/2007 | Launchbury et al. | |
| 2007/0136609 A1 | 6/2007 | Rudelic et al. | |
| 2008/0282128 A1* | 11/2008 | Lee et al. | 714/755 |
| 2009/0307444 A1 | 12/2009 | Cyr et al. | |
| 2009/0313416 A1* | 12/2009 | Nation | 711/100 |
| 2010/0058046 A1 | 3/2010 | John et al. | |
| 2010/0293317 A1 | 11/2010 | Confalonieri et al. | |
| 2011/0066790 A1* | 3/2011 | Mogul et al. | 711/103 |
| 2011/0307653 A1 | 12/2011 | Rudelic et al. | |

OTHER PUBLICATIONS

Zhou, Ping, et al. "A durable and energy efficient main memory using phase change memory technology." ACM SIGARCH Computer Architecture News. vol. 37. No. 3. ACM, 2009.*

(Continued)

*Primary Examiner* — Tuan Thai
(74) *Attorney, Agent, or Firm* — Knobbe Martens Olson and Bear LLP

(57) ABSTRACT

Subject matter disclosed herein relates to validating memory content in persistent main memory of a processor.

16 Claims, 4 Drawing Sheets

(56) References Cited

OTHER PUBLICATIONS

Condit, Jeremy, et al. "Better I/O through byte-addressable, persistent memory." Proceedings of the ACM SIGOPS 22nd symposium on Operating systems principles. ACM, 2009.*

Wu, Michael, and Willy Zwaenepoel. "eNVy: a non-volatile, main memory storage system." ACM SigPlan Notices. vol. 29. No. 11. ACM, 1994.*

Mangalagiri, Prasanth, et al. "A low-power phase change memory based hybrid cache architecture." Proceedings of the 18th ACM Great Lakes symposium on VLSI. ACM, 2008.*

U.S. Appl. No. 12/797,512, filed Jun. 9, 2010, 32 pages.

U.S. Appl. No. 12/797,522, filed Jun. 9, 2010, 35 pages.

U.S. Appl. No. 12/895,574, filed Sep. 30, 2010, 41 pages.

Intel "An Introduction to the Intel® QuickPath Interconnect" Jan. 2009, pp. 1-22, Document No. 320412-001US, Intel Corporation.

* cited by examiner

VALIDATING PERSISTENT MEMORY CONTENT FOR PROCESSOR MAIN MEMORY

BACKGROUND

1. Field

Subject matter disclosed herein relates to validating memory content in persistent main memory of a processor.

2. Information

Central processing units (CPUs) are employed in many types of electronic devices, such as computers, cell phones, PDA's, data loggers, games, and navigational equipment, for example. Among such electronic devices, various configurations of one or more CPUs may be employed, such as in a multi-processor system, for example. CPUs may be associated with memory devices to carry out particular functions. For example, a CPU may be associated with a main memory to maintain one or more applications hosted by the CPU. In another example, a CPU may be associated with cache memory to provide relatively fast access to various types of stored information.

Occasionally, a processor may experience an operational fault, an error, and/or a power loss event. Such an event may result in information loss. Subsequent to such an event, a processor may go through a reboot process, for example, and attempt to recover and/or replace such lost information from an external memory, such as a hard drive.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figures 1, 2:
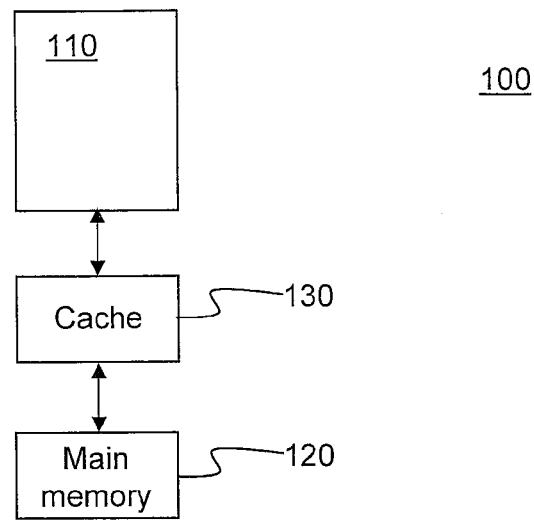
FIG. 1 is a schematic diagram of a system configuration, according to an embodiment.
FIG. 2 is a schematic diagram of a processor system, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein may include main memory comprising persistent memory. For example, persistent memory may comprise nonvolatile memory such as phase change memory (PCM), NOR flash, and NAND flash. Accordingly, persistent main memory may comprise a memory array that includes nonvolatile memory. In one implementation, persistent main memory may include a memory array of which one portion comprises one or more types of nonvolatile memory and another portion comprises volatile memory, as described below. In another implementation, persistent main memory may include a memory array comprising only nonvolatile memory, though claimed subject matter is not so limited. Herein, main memory refers to memory that may be used by a processing entity to maintain one or more applications that are executable by the processing entity, though claimed subject matter is not limited in this respect. In an implementation, particular portions of persistent main memory may be accessed by a processing entity by directly addressing such particular portions, for example. Direct addressing may comprise a process where a processing entity may issue an address to read a particular location in a memory, and the particular location is subsequently read. In contrast, indirectly addressing a memory may comprise a process that involves an input/output (I/O) device to which a processing entity may issue an address to read a particular location in a memory. In this case, the I/O device may respond by presenting (read) data that's in that particular location. For example, basic input/output system (BIOS) software may be stored on a non-volatile, read-only memory (ROM) and/or flash memory that are not accessible by direct addressing by a processing entity.

In an embodiment, a system comprising a processing entity, such as a central processing unit (CPU), may include persistent memory. For example, persistent memory may comprise at least a portion of main memory and/or cache memory to be used by a CPU. Such a system, for example, may comprise a computing system to execute applications in any of a number of environments, such as computers, cell phones, PDA's, data loggers, and navigational equipment, just to name a few examples. In an implementation, such a system may include a resource manager for virtualization, such as a hypervisor, for example. In some examples, a main memory and/or cache memory may comprise a portion of persistent memory and a portion of other type of random access memory (RAM). In a particular example, main memory may include at least a portion of PCM and dynamic random access memory (DRAM). Such memory configurations may provide benefits such as non-volatility, relatively high program/read speeds, and/or extended PCM life, for example. Main memory that includes persistent memory may provide another benefit such as avoiding a need to load executable instructions and/or other information from a non-volatile memory into volatile DRAM, such as during a processor reboot process, for example. Accordingly, increased memory operation speed (e.g., read, write, or erase operations), shortened reboot time, and/or reduced memory device power consumption may be among a number of advantages provided by main memory that includes persistent memory. Of course, such features and details of an embodiment that includes PCM or other persistent memory as a main memory are merely examples, and claimed subject matter is not so limited.

In an embodiment, a method of operating a memory system may include a technique for re-booting or re-initializing a processor subsequent to the processor experiencing a particular disruptive event. Such a technique may utilize information stored in a persistent main memory of the processor, wherein at least a portion of such main memory may comprise persistent memory. If particular information useful for re-booting or re-initializing a processor is stored in persistent main memory, retrieving such particular information from an external memory, such as flash or a hard disk for example, need not occur. As a result, performance (e.g., operating speed) of a memory system may be improved. The term "disruptive event" means an event, condition, and/or situation that result in at least a partial disruption of processor performance. Such a disruptive event may comprise a fault, a power loss, deactivation, and so on, just to name a few examples. Further, the terms "boot", "reboot", "initialize", and "re-initialize" are interchangeable with one another. Although such terms are often used herein to describe processes subsequent to a disruptive event, such a disruptive event need not occur for such processes to follow, and claimed subject matter is not so limited.

During processor operations, information may be written to or read from a persistent main memory. If a processor experiences a disruptive event, such information need not be lost from a persistent main memory, even though a processor may unexpectedly shut down. Accordingly, such information may be stored in persistent main memory and available for re-initializing (e.g., rebooting) the processor. In one implementation, such stored information may be used to return a processor to an operating state that is substantially the same as the operating state just prior to a disruptive event. In such cases, re-initializing the processor or returning a processor to an earlier operating state need not involve loading or re-loading information into a main memory from an external hard-drive or other nonvolatile memory, for example. However, at least a portion of information retained by a persistent main memory following a disruptive event may have been corrupted, for example, if such a portion was being written to the persistent main memory at the time that a disruptive event occurred. For example, a write operation performed by a processor may be disrupted before completion, which may result in stored corrupt information. Thus, a technique for re-booting or re-initializing a processor may include validating integrity of information stored in a persistent main memory, determining whether or not such information is corrupt, as explained below.

In an embodiment, a method of re-booting or re-initializing a processor subsequent to the processor experiencing a disruptive event may include retrieving information from a persistent main memory accessible by the processor, determining validity of the information, and determining whether to replace or reuse portions of the persistent main memory based, at least in part, on whether the information is valid. For example, a valid portion of such information may be used to reboot a processor or return a processor to an earlier operating state, whereas portions of persistent main memory determined to be invalid (e.g., corrupt) may be reloaded from an external hard drive. As mentioned earlier, such invalid portions of persistent main memory may result from an earlier process of a processor that is disrupted by a disruptive event. In one implementation, persistent main memory may include an index of contents of the persistent main memory. Such an index, which will be explained in further detail below, may describe contents and respective locations of such contents in the persistent main memory. For example, such an index may comprise a base page table, which may describe individual pages in persistent main memory. Of course, such details of a method of re-booting or re-initializing a processor are merely examples, and claimed subject matter is not limited in this respect.

In an embodiment, a memory device may comprise a memory controller having at least one interface to connect, via a bus for example, to a processor, and another interface to connect to a persistent main memory. For example, such persistent memory may comprise PCM. Such a memory controller may be adapted to re-initialize the processor or return a processor to an earlier operating state subsequent to a disruptive event experienced by the processor. Such re-initialization may be based, at least in part, on information stored in the persistent main memory. Such a memory device may provide benefits such as non-volatility during a processor disruption and/or deactivation, and/or relatively fast reboot speed, for example. A memory controller may be further adapted to determine validity of the information stored in persistent main memory. For example, at least a portion of such information may be invalid if a disruptive event interrupted the processor during an operation to write to persistent main memory. In such a case, in one implementation, a memory controller may set or reset a flag and/or status bit to indicate that persistent main memory was being written to during a disruptive event. Accordingly, such a flag and/or status bit may indicate whether or not a portion of persistent main memory is valid. Such a flag and/or status bit may be stored in persistent main memory, though claimed subject matter is not so limited. In another implementation, whether or not a portion of persistent main memory is valid may be determined by comparing a parity value of memory contents before a disruptive event to a parity value of the memory contents after the disruptive event, as discussed below. For example, information stored in persistent main memory may comprise memory contents resulting from processes executed prior to a disruptive event. In one implementation, parity of the memory contents may also be stored in persistent main memory, wherein such parity may be determined prior to a disruptive event. For example, parity of a page may be determined if such a page is written to and/or updated. In another implementation, the memory controller may be further adapted to determine parity of memory contents subsequent to a disruptive event. In such a case, validity of the memory contents may be based, at least in part, on a comparison of parity determined prior to the disruptive event with parity determined subsequent to the disruptive event. In yet another implementation, the memory controller may be further adapted to determine whether to replace or reuse portions of persistent main memory based, at least in part, on a determined validity of such portions. Of course, such details of a memory device are merely examples, and claimed subject matter is not limited in this respect.

As mentioned above, during the course of executing an application, for example, a processor may calculate parity for contents of a particular portion of persistent main memory. Such a portion may comprise a page. In such a case, the processor may store the calculated parity for that page to a particular location in persistent main memory. If a disruptive event occurs during a process of writing a page of information to persistent main memory, then page information may become corrupted. In such a case, parity may be used to determine whether such information has become corrupt. Accordingly, during a reboot process, which may occur subsequent to a disruptive event, a memory controller (or other entity performing a reboot process) may utilize parity to determine whether a page maintained in persistent main memory is corrupt (e.g., invalid). If the memory controller determines that information in a page is valid, then such information may be used, avoiding an inconvenient and relatively inefficient process of reloading such information from an external memory, such as a hard drive. Of course, such details regarding parity and page information are merely examples, and claimed subject matter is not so limited.

FIG. 1 is a schematic block diagram of a processing system 100, according to an embodiment. Processing system 100 may comprise CPU 110, main memory 120, and/or cache 130. In particular, CPU 110 may host one or more applications maintained in main memory 120. Though not shown in FIG. 1, processing system 100 may comprise additional CPUs or other such processing entities, additional main memories, and/or additional caches. For example, CPU 110, main memory 120, and/or cache 130 may collectively comprise building blocks for larger multiprocessor systems. In one implementation, processing system 100 may operate using a memory hierarchy that includes one or more levels of cache memory. Any such level may comprise persistent memory shared among multiple CPUs. For example, cache memory may comprise first level cache and second level cache, either of which at least a portion may comprise persistent memory. In another implementation, processing system 100 may include a resource manager to allow multiple operating systems to run concurrently (e.g., hardware virtualization). Such a resource manager, for example, may comprise a hypervisor. Of course, such details of a processing system and cache memory are merely examples, and claimed subject matter is not so limited. In an embodiment, at least a portion of main memory 110 may comprise persistent memory. In a particular implementation, another portion of main memory 110 may comprise other types of memory, such as volatile DRAM. Portions of persistent memory need not be arranged contiguously in main memory 210, which may comprise one or more die structures, for example.

FIG. 2 is a schematic block diagram of a processor system 200, according to an embodiment. Such a processor system may include any number of processing entities, though only one such entity is shown in FIG. 2. In a particular example, such a processing entity may comprise a CPU 210 associated with a cache 230. In one implementation, CPU 210 may include local memory (not shown) comprising embedded persistent memory, for example. In another implementation, CPU 210 may utilize a main memory 220 that includes persistent memory. In particular, persistent memory may be included in a memory hierarchy comprising caches (e.g., various levels of cache) and main memory. At least a portion of such main memory, for example, may comprise PCM. Such a memory hierarchy may be used to manage a distributed memory comprising caches and main memory. CPU 210 (and other CPUs that may be present in a computer platform, for example) may share such a distributed memory.

In one implementation, processor system 200 may comprise a portion of a computing platform, wherein main memory 220 may be used as virtual memory. In such an implementation, cache 230 may comprise a translation lookaside buffer (TLB), which may point to a particular page table that, in turn, may point to one or more individual pages. For example, cache 230, comprising a TLB, may point to a base page table 222 and, in turn, base page table 222 may point to page 226, page 228, and page 229. In another implementation, CPU 210 may execute a task (e.g., an application or a portion thereof), wherein TLB 230 may point to page 228 of main memory 220 that the task is currently using. In an embodiment where main memory 220 comprises volatile memory, such as DRAM for example, memory contents of main memory 220 may be lost if CPU experiences a disruptive event. Such memory content loss is depicted as volatile main memory 240, which is shown subsequent to CPU 210 experiencing a disruptive event. On the other hand, in an embodiment where main memory 220 comprises nonvolatile persistent memory, such as PCM for example, memory contents of main memory 220 may be maintained even if CPU experiences a disruptive event. In such a case, a method of re-booting or re-initializing CPU 210 subsequent to the CPU experiencing a disruptive event is described in detail below. Of course, such details of a processor system are merely examples, and claimed subject matter is not so limited.

Figure 3:
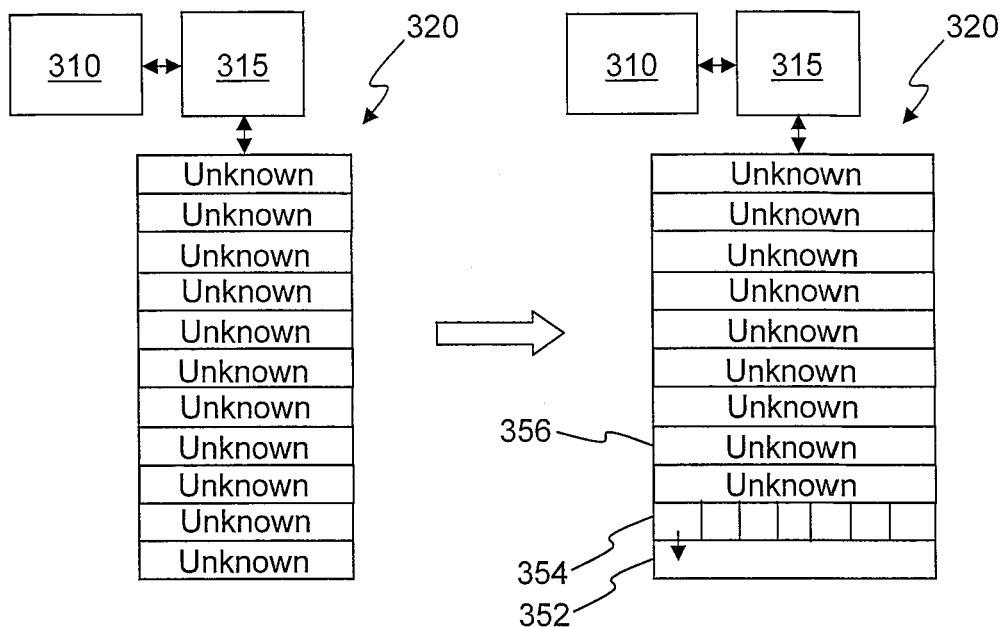
FIG. 3 is a schematic diagram of a main memory, according to another embodiment.

FIG. 3 is a schematic diagram of a persistent main memory 320, according to an embodiment. As shown in FIG. 3, persistent main memory 320 may include memory contents that are as yet unknown, subsequent to CPU 310 experiencing a disruptive event. For example, in early stages of a processor reboot, such a processor may not have access to information on the state of main memory 320. As mentioned above, a method of re-booting or re-initializing a processor subsequent to the processor experiencing a disruptive event may include retrieving information from persistent main memory 320, determining validity of the information, and determining whether to replace or reuse portions of persistent main memory 320 based, at least in part, on whether the information is valid. For example, a valid portion of such information may be used to reboot a processor, whereas portions of persistent main memory determined to be invalid (e.g., corrupt) may be reloaded from an external hard drive.

In a particular implementation, and in the following description, persistent main memory may comprise pages, though claimed subject matter is not so limited. For example, persistent main memory 320 may comprise multiple pages, including pages 352, 354, and 356. In particular, page 352 may include a base page table, which may comprise an index describing individual pages in persistent main memory 320. In an implementation, such a base page table may be located in a particular page in persistent main memory 320 to allow a memory controller 315 to perform a process of validating the base page table, for example. Such a validation process may be performed during a CPU boot (or reboot) process. Another portion of persistent main memory 320, such as page 354, may comprise parity information collected prior to CPU 310 experiencing a disruptive event. For example, parity for a page may be stored and/or updated if such a page is modified during program execution, as described above. Accordingly, memory controller 315 may validate the base page table in page 352 by comparing its current parity to its parity (stored in page 354) before CPU 310 experienced a disruptive event. Such a validation process is indicated in FIG. 3 by a short vertical arrow extending from page 354 to page 352. Memory controller 315 may determine the base page table's current parity by any of a number of well-known techniques, such as cyclic redundancy check (CRC), checksum, and so on. Memory controller 315 may consider the page base table to be valid if such parities match one another. In such a case, memory controller 315 may subsequently use the validated page table base as an index to reference individual pages in persistent main memory 320, as explained below. However, if Memory controller 315 determines that the page base table is not valid, then memory controller 315 may reload the page table base from an external memory, such as a hard drive, for example. Though FIG. 4 indicates that parity information may be stored in page 354 adjacent to page 352, where a base page table may be located, claimed subject matter is not limited to such relative locations. For example, either parity information or a base page table may be located at page 356 or other page. Of course, such details of a persistent main memory are merely examples, and claimed subject matter is not so limited.

Figure 4:
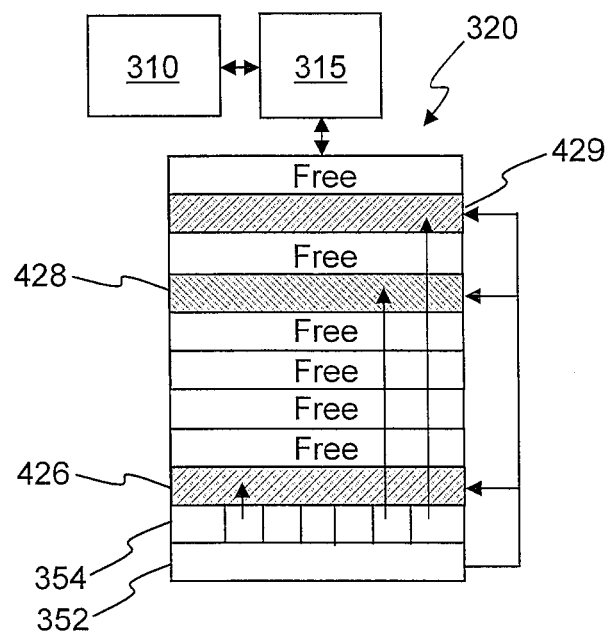
FIG. 4 is a schematic diagram of a process of validating portions of main memory, according to another embodiment.

FIG. 4 is a schematic diagram of a process to validate individual portions of main memory 320, according to an embodiment. For example, such a process may be executed subsequent to a process of validating a page table base, such as the process depicted in FIG. 3 described above. Individual portions of main memory may comprise pages, as mentioned above. Memory controller 315 may validate individual pages by comparing a page's current parity to its earlier parity. Such an earlier parity may have been written to page 354 before CPU 310 experienced a disruptive event, for example. Such a validation process is indicated in FIG. 4 by vertical arrows extending from page 354, where earlier parities of pages may be maintained, to various individual pages. For example, memory controller 315 may validate page 426 by comparing its current parity to its parity (stored in page 354) before CPU 310 experienced a disruptive event. Memory controller 315 may determine a page's current parity by any of a number of well-known techniques, such as cyclic redundancy check (CRC), checksum, and so on. Memory controller 315 may consider page 426 to be valid if such parities match one another. In such a case, memory controller 315 may subsequently use validated page 426, avoiding a need to reload page 426 from an external memory source, such as a hard drive, for example. If such a reloading process is avoided, time may be saved during a processor's reboot process. In particular, if memory controller 315 determines that page 426 is not valid, then memory controller 315 may reload the page table base from an external memory, though claimed subject matter is not limited to such a response to determining an invalid page.

In another example, memory controller 315 may validate pages 428 and/or 429 by respectively comparing current parity to earlier parity stored in page 354. Validation of such pages may be subsequent to validating page 426. In other words, in an implementation, memory controller 315 may sequentially validate multiple pages in main memory 320. Memory controller 315 may consider the pages to be valid if such parities match one another. In such a case, memory controller 315 may subsequently use validated pages 428 and/or 429. However, if Memory controller 315 determines that pages 428 and/or 429 are not valid, then memory controller 315 may reload the pages from an external memory, such as a hard drive, for example. Of course, claimed subject matter is not limited to any particular action by memory controller 315 in response to invalid pages. In other words, a choice of what action to take in response to a corrupted (invalid) page may be determined by a particular application.

Figure 5:
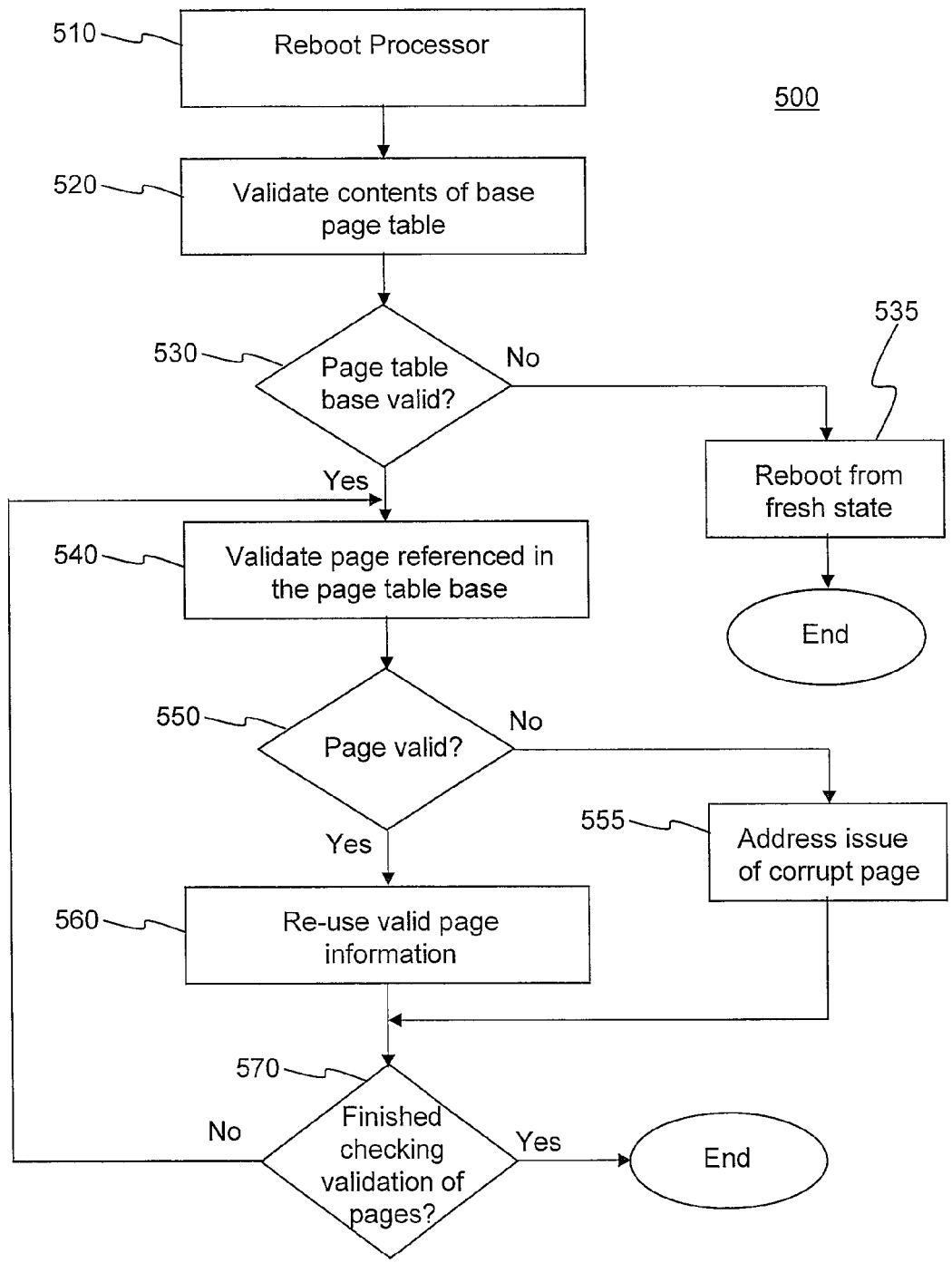
FIG. 5 is a flow diagram of a process to validate information in a main memory, according to an embodiment.

FIG. 5 is a flow diagram of a process 500 to validate information in a main memory, according to another embodiment. For example, such a process may be performed during a process to reboot a processor comprising persistent main memory similar to persistent main memory 320 shown in FIGS. 3 and 4. At block 510, such a processor may be rebooted in response to experiencing a disruptive event. During such an event, an application executed by the processor, for example, may have been disrupted. In such a case, information written to persistent main memory 320 may be incomplete, incorrect, and/or otherwise corrupt. Accordingly, though main memory may comprise persistent memory that maintains information even during events such as a disruptive event, such maintained information may be corrupt (e.g., invalid). Process 500 includes techniques to determine whether information is valid or not.

At block 520, a memory controller may validate contents of a base page table such as that maintained in page 352 of persistent main memory 320. Such validation may be performed by comparing the base page table's current parity to its parity before CPU 310 experienced a disruptive event, as described above. At block 530, the memory controller may consider the page base table to be valid if such parities match one another. If the page base table is not valid, process 500 may proceed to block 535, where the processor may be rebooted from a fresh state, wherein at least portions of persistent main memory, including a page base table, may be reloaded from an external hard drive, for example. However, if the page base table is determined to be valid, then process 500 may proceed to blocks 540 and 550, where the memory controller may validate one or more individual pages referenced by the validated base page table. Such validation may be performed by comparing such pages' current parity value to their earlier parity value, as described above. Such an earlier parity value may have been written to a portion of persistent main memory 320 before the processor experienced a disruptive event (prior to reboot process 500), for example. If a particular page is determined to not be valid, process 500 may proceed to block 555, where the issue of a corrupt, invalid page may be addressed in any number of ways by a particular application and/or reboot protocol. For example, such a particular page may be reloaded from an external hard drive. However, if the particular page is determined to be valid, then process 500 may proceed to block 560, where the memory controller may proceed with the reboot process using valid page information already stored in the persistent main memory during an epoch before process 500 commenced. Process 500 may then proceed to block 570 where a determination may be made as to whether pages in persistent main memory have been validated. If not, the process 500 may proceed to block 540, where a subsequent page may be validated, for example. Of course, such details of process 500 are merely examples, and claimed subject matter is not so limited.

Figure 6:
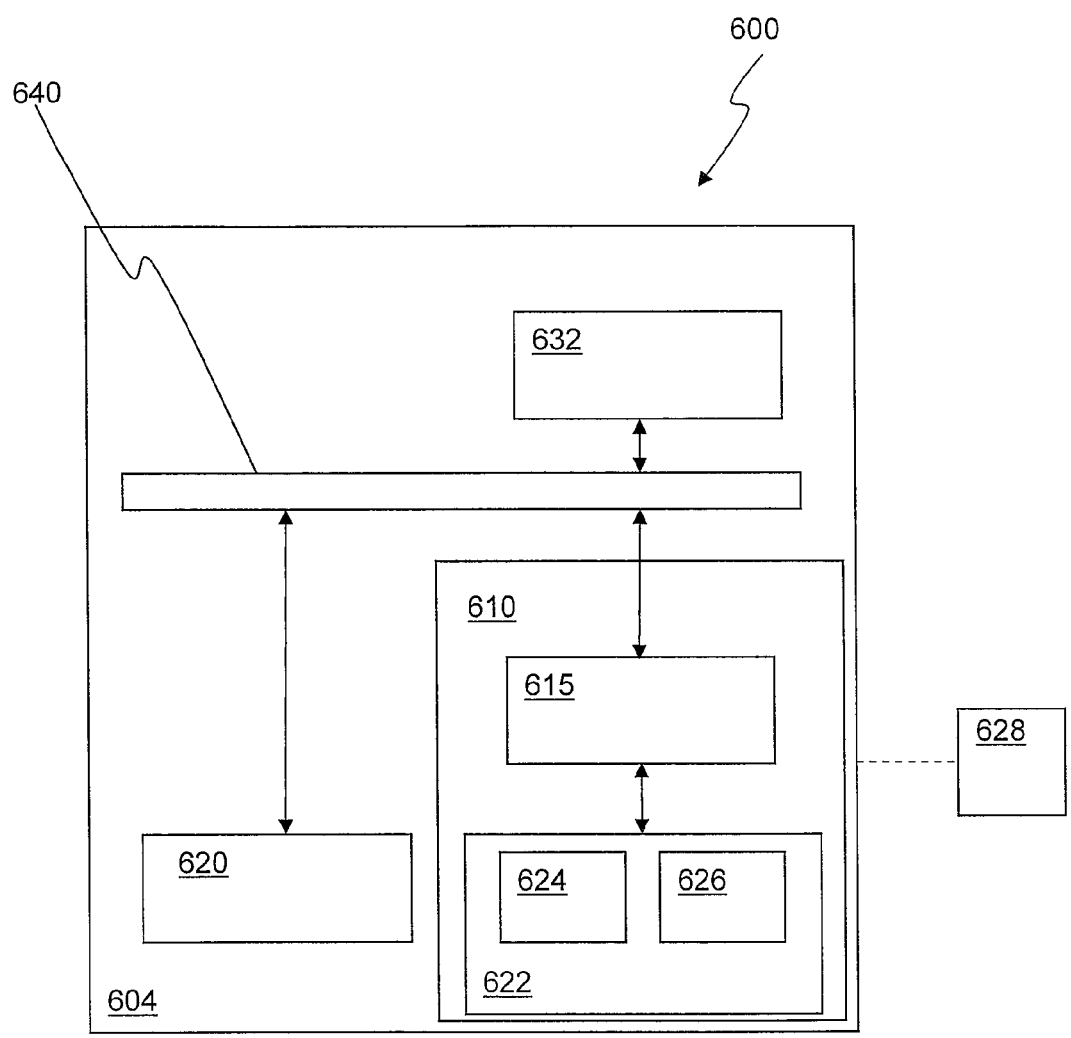
FIG. 6 is a schematic view of a computing system and a memory device, according to an embodiment.

FIG. 6 is a schematic diagram illustrating an exemplary embodiment of a computing system 600 including a memory device 610. A computing device 604 may be representative of any device, appliance, or machine that may be configurable to manage memory device 610. Memory device 610 may include a memory controller 615 and a memory 622. By way of example but not limitation, computing device 604 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

In an embodiment, computing device 604 may include one or more processing units 620 operatively coupled to memory 622 through a bus 640 and a host or memory controller 615. Processing unit 620 is representative of one or more circuits configurable to perform at least a portion of a data computing procedure or process. By way of example but not limitation, processing unit 620 may include one or more processors, controllers, microprocessors, microcontrollers, application specific integrated circuits, digital signal processors, programmable logic devices, field programmable gate arrays, and the like, or any combination thereof. Processing unit 620 may communicate with memory controller 615 to process memory-related operations, such as read, write, and/or erase, as well as processor rebooting discussed above, for example. Processing unit 620 may include an operating system adapted to communicate with memory controller 615. Such an operating system may, for example, generate commands to be sent to memory controller 615 over bus 640. Such commands may include read/write instructions, for example. In one implementation, a hypervisor may allow one or more additional operating systems to run concurrently. For example, such a hypervisor may comprise a resource (e.g., memory 622, processing unit 620, and input/output 632) manager to allow for virtual environments.

Memory 622 is representative of any data storage mechanism. Memory 622 may include, for example, a DRAM 624 and/or a persistent memory 626. In a particular embodiment, memory 622 may comprise a main memory that includes at least a portion of persistent memory, as described above. Memory 622 may also comprise cache memory that may likewise include at least a portion of persistent memory. While illustrated in this example as being separate from processing unit 620, it should be understood that all or part of DRAM 624 may be provided within or otherwise co-located/coupled with processing unit 620.

According to an embodiment, one or more portions of memory 622 may store signals representative of data and/or information as expressed by a particular state of memory 622. For example, an electronic signal representative of data and/or information may be "stored" in a portion of memory 622 by affecting or changing the state of such portions of memory 622 to represent data and/or information as binary information (e.g., ones and zeros). As such, in a particular implementation, such a change of state of the portion of memory to store a signal representative of data and/or information constitutes a transformation of memory 622 to a different state or thing.

In one embodiment, system 600 may comprise a processor 620 to host one or more applications, and a memory device comprising a memory controller or other circuitry. Such a memory controller or other circuitry may include at least a first interface to a persistent main memory and at least a second interface to processor 620 (e.g., via bus 640 to processor 620), wherein the memory controller or other circuitry may be capable of retrieving information from the persistent main memory, determining validity of the information, and determining whether to replace or reuse portions of the persistent main memory based, at least in part, on the determined validity. Such persistent memory may comprise PCM, for example. In one implementation, such a memory controller or other circuitry need not comprise a portion of a memory device, but instead may be disposed in any portion of system 600.

Computing device 604 may include, for example, an input/output 632. Input/output 632 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 632 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   A. rebooting a processor that is configured to access a persistent main memory in response to an occurrence of a disruptive event experienced by said processor, said persistent main memory comprising volatile and non-volatile memory;
   B. determining validity of a base table maintained in the persistent main memory with a memory controller, wherein if the base table is invalid, the processor is rebooted so that the base table is reloaded from an external drive, and wherein if the base table is valid proceed to step C;
   C. validating an individual page referenced by the validated base page table by the memory controller, wherein if the individual page is not valid, reload the individual page from the external drive and proceed to step E, and wherein if the individual page is valid proceed to step D;
   D. re-using valid individual page information; and
   E. repeating step C until every individual page in the validated base page table is validated.

2. The method of claim 1, wherein invalidity of said base table or individual page results from a process of said processor that is disrupted by said disruptive event.

3. The method of claim 1, further comprising storing said individual page in said persistent main memory.

4. The method of claim 1, wherein said persistent memory comprises phase change memory (PCM).

5. The method of claim 1, further comprising setting or resetting a flag to indicate that said nonvolatile memory was being written during a disruptive event.

6. The method of claim 5, wherein the disruptive event is a power loss.

7. A memory device comprising:
   circuitry to re-initialize a processor that is configured to access a persistent main memory subsequent to a disruptive event experienced by said processor, said persistent main memory comprising volatile and nonvolatile memory, wherein said circuitry is configured to:
   A. retrieve a base table maintained in said persistent main memory and determine validity of said base table wherein if the base table is invalid, the circuitry is configured to reboot the processor so that the base table is reloaded from an external drive, and wherein if the base table is valid, the circuitry is configured to proceed to step B;
   B. validate an individual page referenced by the validated base page table by the memory controller, wherein if the individual pages is not valid, reload the individual page from the external drive and proceed to step D, and wherein if the individual page is valid proceed to step C;
   C. re-use valid individual page information; and
   D. repeat step B until every individual page in the validated base page table is validated.

8. The memory device of claim 7, wherein said base table and individual page comprise memory contents resulting from processes executed prior to said disruptive event.

9. The memory device of claim 8, wherein said base table and individual page comprise a parity value of said memory contents, said parity value determined prior to said disruptive event.

10. The memory device of claim 9, wherein said circuitry is further adapted to determine a parity value of said memory contents subsequent to said disruptive event, and wherein said validity is based, at least in part, on a comparison of said parity value determined prior to said disruptive event with said parity value determined subsequent to said disruptive event.

11. The memory device of claim 7, wherein invalidity of said base table or individual page results from a process of said processor that is disrupted by said disruptive event.

12. The memory device of claim 7, wherein said persistent main memory comprises phase change memory (PCM).

13. The memory device of claim 7, further comprising a memory controller configured to set or reset a flag to indicate that said nonvolatile memory was being written during a disruptive event.

14. A system comprising:
- a processor to host one or more applications, the processor configured to access a persistent main memory; and
- a memory device comprising:
    - circuitry having at least a first interface to said persistent main memory comprising volatile and nonvolatile memory and at least a second interface to said processor, wherein said circuitry is configured to:
    - A. retrieve a base table maintained in said persistent main memory and determine validity of said base table, wherein if the base table is invalid, the circuitry is configured to reboot the processor so that the base table is reloaded from an external drive, and wherein if the base table is valid, the circuitry is configured to proceed to step B;
    - B. validate an individual page referenced by the validated base page table by the memory controller, wherein if the individual pages is not valid, reload the individual page from the external drive and proceed to step D, and wherein if the individual page is valid proceed to step C;
    - C. re-use valid individual page information; and
    - D. repeat step B until every individual page in the validated base page table is validated.

15. The system of claim 14, further comprising a hypervisor to provide a virtual environment.

16. The system of claim 14, further comprising a memory controller configured to set or reset a flag to indicate that said nonvolatile memory was being written during a disruptive event.

* * * * *